(12) United States Patent
Shimizu et al.

(10) Patent No.: US 6,858,863 B2
(45) Date of Patent: Feb. 22, 2005

(54) SEMICONDUCTOR LASER DEVICE HAVING A HIGH CHARACTERISTIC TEMPERATURE

(75) Inventors: Hitoshi Shimizu, Tokyo (JP); Kouji Kumada, Tokyo (JP); Norihiro Iwai, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/094,733

(22) Filed: Mar. 8, 2002

(65) Prior Publication Data

US 2003/0013224 A1 Jan. 16, 2003

(30) Foreign Application Priority Data

Apr. 25, 2001 (JP) .......................................... 2001-127476
Sep. 17, 2001 (JP) .......................................... 2001-281240

(51) Int. Cl.[7] ............................................. H01L 29/06
(52) U.S. Cl. ............................... 257/16; 257/18; 257/22
(58) Field of Search ............................ 257/101, 14, 16, 257/17, 18, 22, 94, 88, 90, 96, 97, 103, 189

(56) References Cited

U.S. PATENT DOCUMENTS 6,153,894 A * 11/2000 Udagawa ...................... 257/96
2002/0034203 A1 * 3/2002 Shimizu et al. ............... 372/45

FOREIGN PATENT DOCUMENTS

JP        2000-277867        6/2000

* cited by examiner

*Primary Examiner*—Wael Fahmy
*Assistant Examiner*—Ginette Peralta
(74) *Attorney, Agent, or Firm*—Oblon, Spivak, McClelland, Maier & Neustadt, P.C.

(57) ABSTRACT

A semiconductor laser device includes a resonant cavity formed on a GaAs substrate, the resonant cavity including a quantum well (QW) active layer structure having a GaInNAs(Sb) well layer and a pair of barrier layers. The QW structure has a conduction band offset energy ($\Delta Ec$) equal to or higher than 350 milli-electron-volts (meV) between the well layer and the barrier layers, and each of the barrier layers a tensile strain equal to or lower than 2.5%.

39 Claims, 10 Drawing Sheets

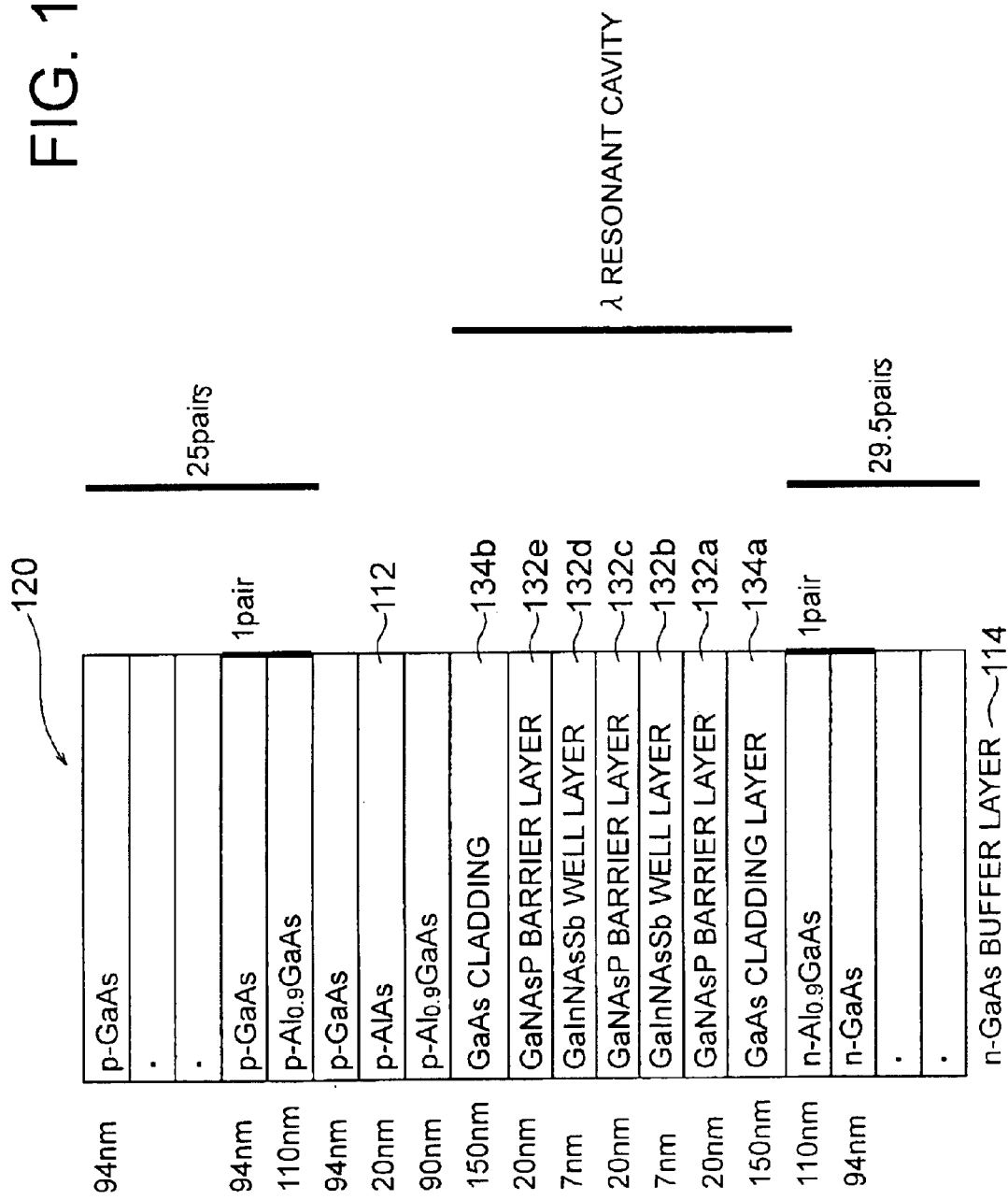

SEMICONDUCTOR LASER DEVICE HAVING A HIGH CHARACTERISTIC TEMPERATURE

BACKGROUND OF THE INVENTION

1. Field of the Invention

The present invention relates to a semiconductor laser device having a high characteristic temperature and, more particularly, to a semiconductor laser device having a high characteristic temperature and operating with a lower threshold current density at a room temperature.

2. Description of the Related Art

A semiconductor laser device having an emission wavelength of 1.3 μm band and operating with a small optical dispersion within an optical fiber is expected to be used as a light source in the subscriber's optical device in an optical communication system.

As a typical example of such a semiconductor laser device having an emission wavelength of 1.3 μm, a GaInAsP-based semiconductor laser device formed on an InP substrate is being developed. In this respect, a GaInAsP-based semiconductor laser device operating with a threshold current as low as 1 mA or less at a room temperature is expected for practical use. However, this semiconductor laser device has a poor characteristic temperature of the threshold as low as 50K to 70K, and accordingly, it is necessary that this semiconductor laser device be cooled by using a cooling device for a stable operation thereof.

Although there are strong requests that a laser transmission module having a built-in semiconductor laser device be reduced in size and have a lower power dissipation, the cooling device for improving the characteristic temperature of the laser device does not meet these requests. Thus, it is desired to develop a long-wavelength semiconductor laser device having an improved characteristic temperature and without the need for the cooling device.

Patent Publication JP-A-2000-277867 describes a semiconductor laser device formed on a GaAs substrate and having an improved characteristic temperature around 180K. This semiconductor laser device has a quantum well (QW) active layer structure including a GaInNAs well layer having a nitrogen content of 3% or less and a pair of AlGaInAsPN or GaAsP barrier layers having a negative strain with respect to the GaAs substrate. It is reported that the samples of this semiconductor laser device exhibited characteristic temperatures as high as around 130K to 200K in the experiments.

FIG. 1 schematically shows a typical layer structure for the conventional GaInNAs-based semiconductor laser device. The semiconductor laser device, generally designated by numeral 10, includes an n-type GaAs (n-GaAs) substrate 12, and a layer structure epitaxially grown on the (100) lattice plane of the n-GaAs substrate 12. The layer structure includes, consecutively as viewed from the bottom, a 0.2-μm-thick n-GaAs buffer layer 14, a 1.5-μm-thick n-InGaP cladding layer 16, a 0.1-μm-thick GaAs barrier layer 18, a 8-nm-thick GaInNAs(Sb) well layer 20, a 0.1-μm-thick GaAs barrier layer 22, a 1.5-μm-thick p-InGaP cladding layer 24 and a p-GaAs cap layer 26.

In the conventional semiconductor laser device lasing at a wavelength of 1300 nm band, the $Ga_xIn_{1-x}N_{1-y}As_y$ well layer constituting the laser active layer has an In content (1-x) of 0.3 to 0.4, and a nitrogen content (1-y) of 0.005 to 0.02. A minute amount of Sb may be added to the GaInNAs well layer for improvement of the crystallinity thereof by an amount of, for example, 0.3 to 2% with respect to the amount of the V-group atoms to obtain a GaInNAsSb well layer. This is expressed by the formula GaInNAs(Sb) designating the above well layer in this text. The barrier layer is generally implemented by a GaAs layer.

For further improvement of the crystallinity of the active layer structure, the well layer and the barrier layers are subjected to a thermal treatment at a high temperature between 500 and 850 degrees C., after the epitaxial growth using a MOCVD or gas source MBE technique. This high-temperature thermal treatment increases the photoluminescence (PL) intensity of the epitaxial layers by several times compared to the PL intensity of the as-grown epitaxial layers, i.e., the epitaxial layers before the thermal treatment. The high-temperature thermal treatment causes the bandgap of the GaInNAs(Sb) well layer to be changed to a shorter emission wavelength.

The GaInNAs-based semiconductor laser device reported heretofore has a problem in that the threshold current density thereof at a room temperature is higher than the threshold current density of a GaInAsP-based semiconductor laser device formed on an InP substrate.

SUMMARY OF THE INVENTION

In view of the above, it is an object of the present invention to provide a long-wavelength semiconductor laser having a high characteristic temperature and a low threshold current density at a room temperature.

The present invention provides, in a first aspect thereof, a semiconductor laser device including a GaAs substrate, and a resonant cavity formed on the GaAs substrate for emitting laser, the resonant cavity including a quantum well (QW) active layer structure having a GaInNAs(Sb) well layer and a pair of barrier layers sandwiching therebetween the GaInNAs(Sb) well layer, each of the barrier layers having a conduction band offset energy equal to or higher than 350 milli-electron-volts (meV) and a strain equal to or lower than 2.5%.

The present invention provides, in a second aspect thereof, a semiconductor laser device including a GaAs substrate, and a resonant cavity formed on the GaAs substrate for emitting laser, the resonant cavity including a quantum well (QW) active layer structure having a GaInNAs(Sb) well layer and a pair of $Al_xGa_{1-x}N_yAs_{1-y}$ barrier layers sandwiching therebetween the GaInNAs(Sb) well layer, wherein given x and y satisfy $0.01 \leq x \leq 1$ and $0.001 \leq y \leq 0.05$, respectively.

In accordance with the semiconductor laser devices of the present invention, the specific configuration of the QW active layer structure allows the semiconductor laser device to have a superior crystallinity and a lower threshold current density, thereby raising the conduction band offset energy of the QW active layer structure between the well layer and the barrier layers and achieving a higher characteristic temperature of the semiconductor laser device, The above and other objects, features and advantages of the present invention will be more apparent from the following description, referring to the accompanying drawings.

BRIEF DESCRIPTION OF THE DRAWINGS

FIG. 11 is a schematic perspective view of a vertical cavity surface emitting semiconductor laser device according to a third embodiment of the present invention.

PREFERRED EMBODIMENTS OF THE INVENTION

Before describing preferred embodiments of the present invention, the principle of the present invention will be described for a better understanding of the present invention.

Figure 2A:
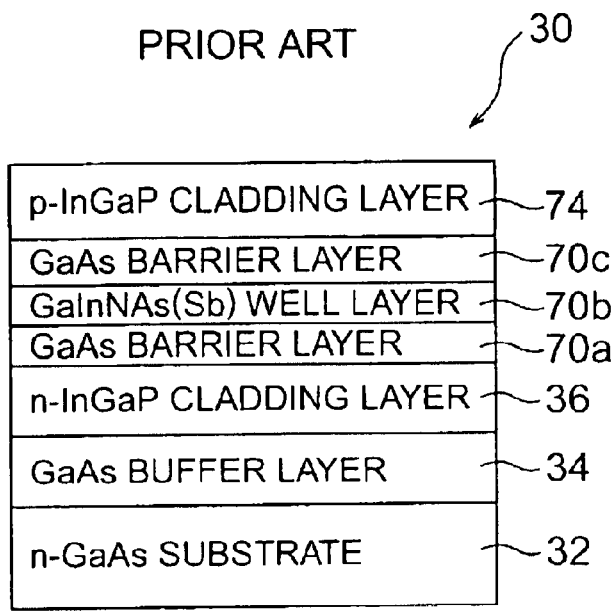
FIGS. 2A and 2B are schematic sectional views of the layer structure of samples used in the experiments.
Figure 2B:
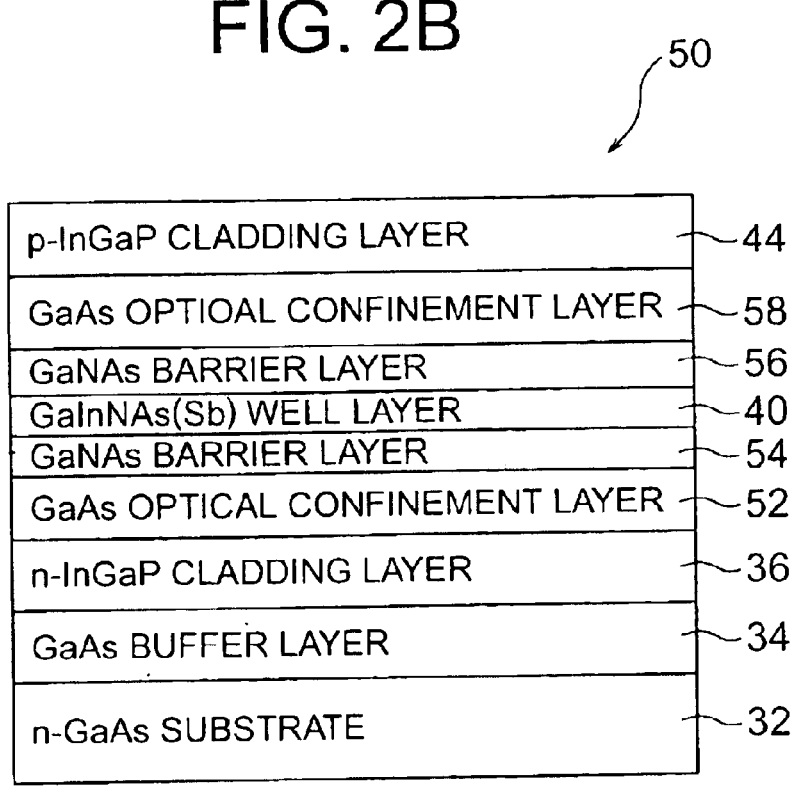

The present inventors noted the QW structure of the semiconductor laser device including the GaInNAs(Sb) well layer and the GaNAs barrier layers, and fabricated a plurality of samples each shown in FIG. 2A or FIG. 2B. The samples 30 of FIG. 2A corresponded to the conventional structure and the samples 50 of FIG. 2B corresponded to a comparative example of the present invention.

Figure 1:
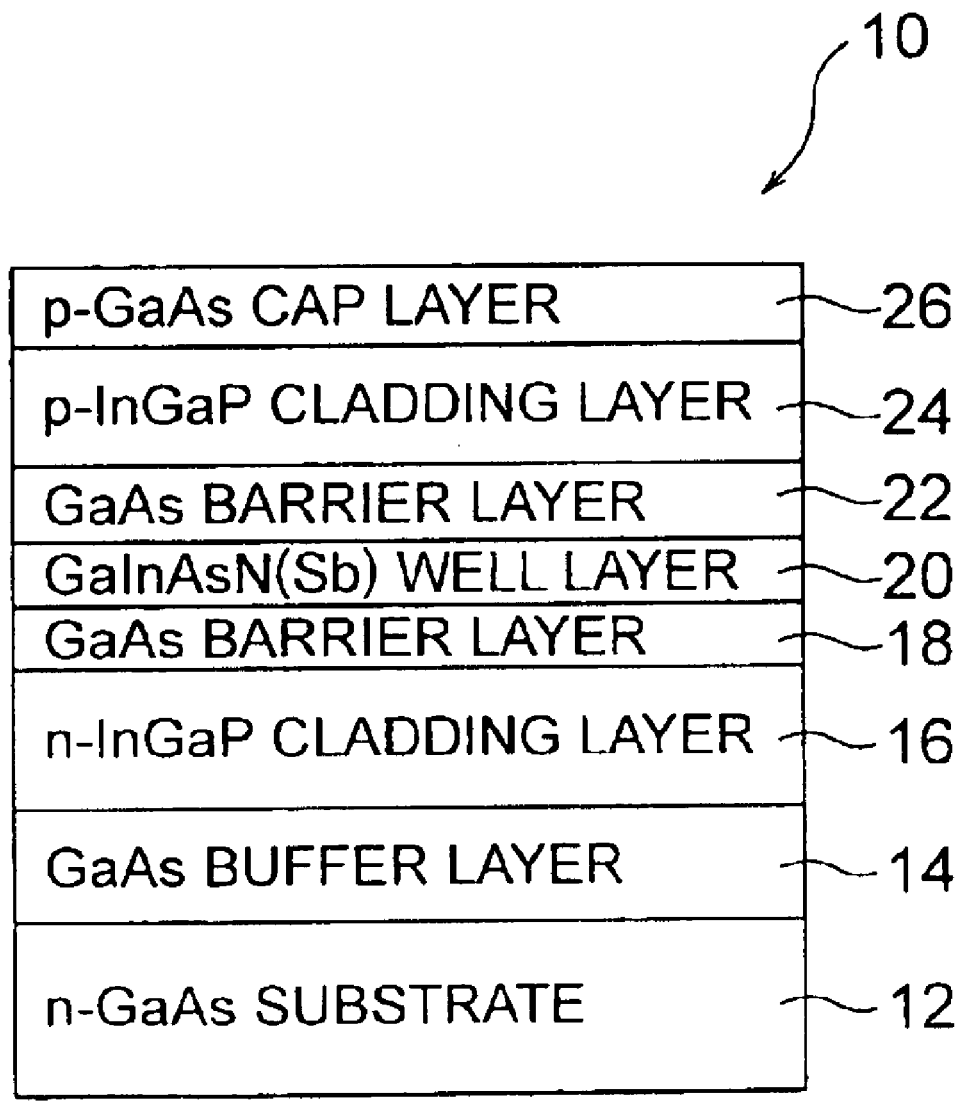
FIG. 1 is a schematic sectional view of the layer structure of a conventional 1 semiconductor laser device.

Each conventional sample 30 included a GaAs substrate 32, and a layer structure formed on the (100) lattice plane of the GaAs substrate 32 and configured to a form resonant cavity. The layer structure included, consecutively as viewed from the bottom, a 0.2-μm-thick n-GaAs buffer layer 34, a 0.2-μm-thick n-InGaP cladding layer 36, a 0.1-μm-thick GaAs barrier layer 38, a 8-nm-thick GaInNAs(Sb) well layer 40, a 0.1-μm-thick GaAs barrier layer 42, and a 0.2-m-thick p-InGaP cladding layer 44. In short, the conventional samples had a structure similar to the GaInNAs-based semiconductor laser device of FIG. 1 having an emission wavelength of 1.3 μm except for the thickness of the cladding layers.

Figure 3:
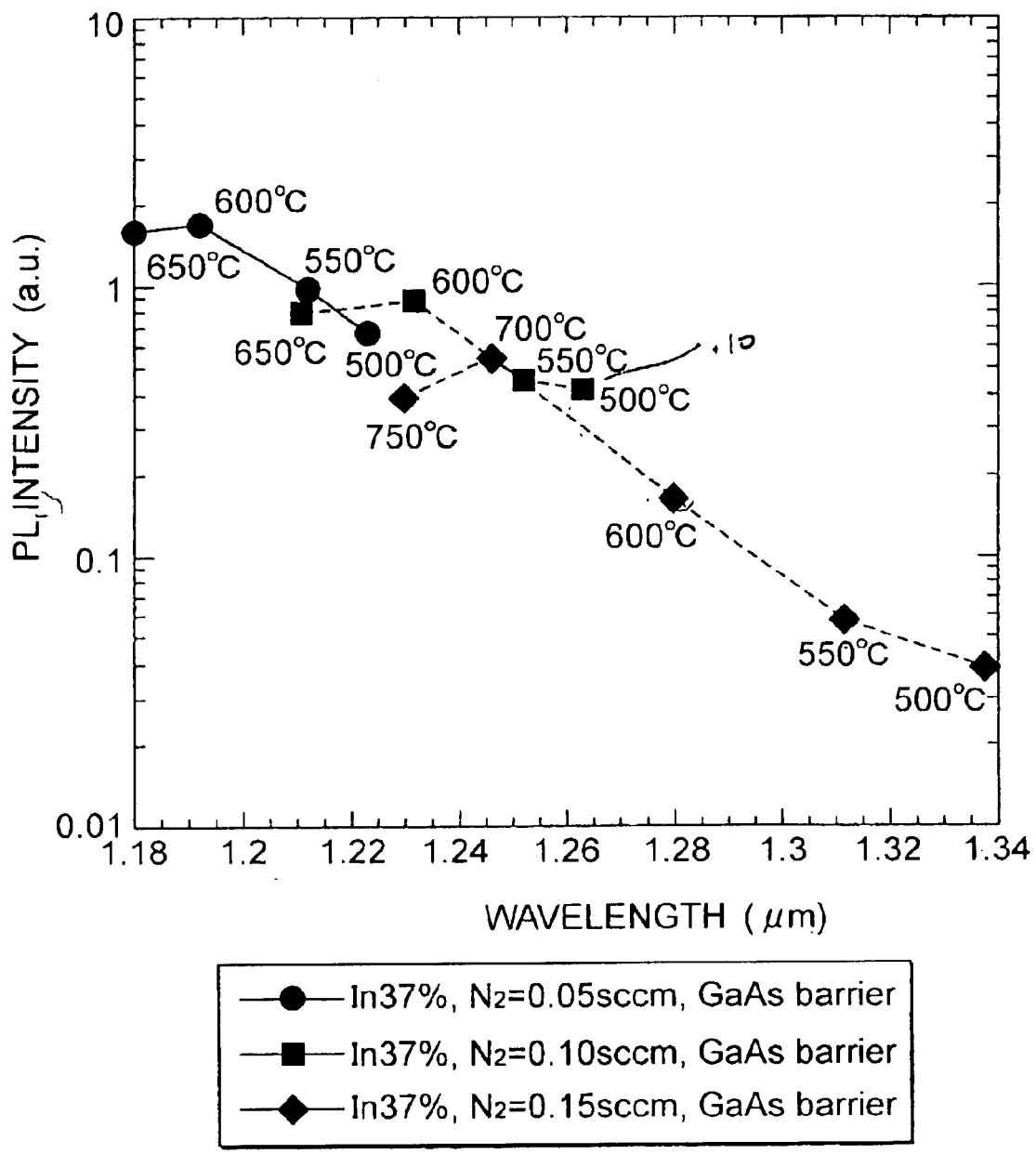
FIG. 3 is a graph showing the relationship between the PL intensity and the wavelength in the case of GaAs barrier layers.

In fabrication of the conventional samples 30, the nitrogen flow rate in the growth step for the GaInNAs(Sb) well layer was selected at 0.05 sccm, 0.10 sccm and 0.15 sccm, with the In content being fixed at 37%. In addition, thermal treatments, after the well layer and the barrier layers were grown at a fixed temperature of 460 degrees C., were conducted for the respective samples at different temperatures ranging between 500 and 750 degrees C. The resultant conventional samples 30 were subjected to measurements for the PL wavelength and PL intensity, the results of the measurements being shown in FIG. 3 for the respective nitrogen flow rates and the respective treatment temperatures. In FIG. 3, the PL wavelength (μm) is plotted on abscissa, and the PL intensity (a.u.) is plotted on ordinate, thereby showing the wavelength dependency of the PL intensity.

The results shown in FIG. 3 is also tabulated in Tables 1, 2 and 3.

TABLE 1

| Treatment temperature (degrees C.) | Wavelength (μm) | PL intensity (a.u.) |
|---|---|---|
| 500 | 1.223 | 0.69 |
| 550 | 1.212 | 0.99 |
| 600 | 1.192 | 1.7 |
| 650 | 1.181 | 1.58 |

(GaAs barrier, In content of 37%, nitrogen flow rate of 0.05 sccm)

TABLE 2

| Treatment temperature (degrees C.) | Wavelength (μm) | PL intensity (a.u.) |
|---|---|---|
| 500 | 1.263 | 0.43 |
| 550 | 1.252 | 0.47 |
| 600 | 1.232 | 0.9 |
| 650 | 1.211 | 0.81 |

(GaAs barrier, In content of 37%, nitrogen flow rate of 0.10 sccm)

TABLE 3

| Treatment temperature (degrees C.) | Wavelength (μm) | PL intensity (a.u.) |
|---|---|---|
| 500 | 1.338 | 0.04 |
| 550 | 1.312 | 0.06 |
| 600 | 1.280 | 0.17 |
| 650 | 1.266 | 0.28 |
| 700 | 1.246 | 0.56 |
| 750 | 1.230 | 0.40 |

(GaAs barrier, In content of 37%, nitrogen flow rate of 0.15 sccm)

By performing a high-temperature thermal treatment, the PL intensity of the epitaxial GaInNAs(Sb) layer was increased by several times as compared to the PL intensity of the as-grown epitaxial layer, with the bandgap of the GaInNAs(Sb) well layer being changed toward a shorter emission wavelength.

The relationship between the wavelength and the PL intensity of the QW active layer structure is exemplified by circular dots in FIG. 3 for the case of an In content of 37% and a nitrogen flow rate of 0.05 sccm. As understood from this relationship, the wavelength is changed to 1.223 μm by the thermal treatment at 500 degrees C., to 1.212 μm by the thermal treatment at 550 degrees C. and to 1.181 μm by the thermal treatment at 650 degrees C.

The relationship between the PL wavelength and the PL intensity is determined approximately by a specified curve in the conventional laser device irrespective of the composition of the well layer and the conditions for the annealing. In this relationship, a longer PL wavelength is accompanied by a lower PL intensity. For example, the PL intensity at a wavelength of around 1.3 μm is lower by 1/20 compared to the PL intensity at a wavelength of around 1.2 μm.

It is considered that the reduction of the PL intensity toward the longer wavelength side results from the degradation of the crystallinity of the well layer due to the larger nitrogen content thereof, which is employed for enlarging the PL wavelength of the laser device.

The comparative examples 50 shown in FIG. 2B had $GaN_{1-y}As_y$ barrier layers, and subjected to the measurement similarly to the conventional samples.

More specifically, the each comparative example 50 included a GaAs substrate 32, and a layer structure formed on the (100) lattice plane of the GaAs substrate 32 and configured to form a resonant cavity. The layer structure included, consecutively as viewed from the bottom, a 0.2-μm-thick n-GaAs buffer layer 34, a 0.2-μm-thick n-InGaP cladding layer 36, a 0.08-μm-thick GaAs optical confinement layer 52, a 0.03 μm-thick GaNAs barrier layer 54, a 8-nm-thick GaInNAs(Sb) well layer 40, a 0.03-μm-thick GaNAs barrier layer 56, a 0.08-μm-thick GaAs optical confinement layer 58, and a 0.2-μm-thick p-InGaP cladding layer 44. In short, the comparative examples had a structure similar to the conventional samples 30 except that the GaAs barrier layers 38 and 42 in the conventional sample 30 are replaced by the GaAs optical confinement layer 52, GaNAs barrier layer 54, GaNAs barrier layer 56 and GaAs optical confinement layer 58 in the comparative example 50.

In fabrication of the comparative examples 50, the nitrogen flow rate is selected at 0.05 sccm and 0.15 sccm during epitaxial growth of the GaInNAs(Sb) well layer, with the In content thereof being fixed at 37%. In addition, a thermal treatment was conducted for each of the samples at a temperature ranging between 500 and 750 degrees C. The relationship between the PL wavelength and the PL intensity was measured for respective samples, the results of the measurements being shown in FIG. 4 by circular dots and square dots.

Figure 4:
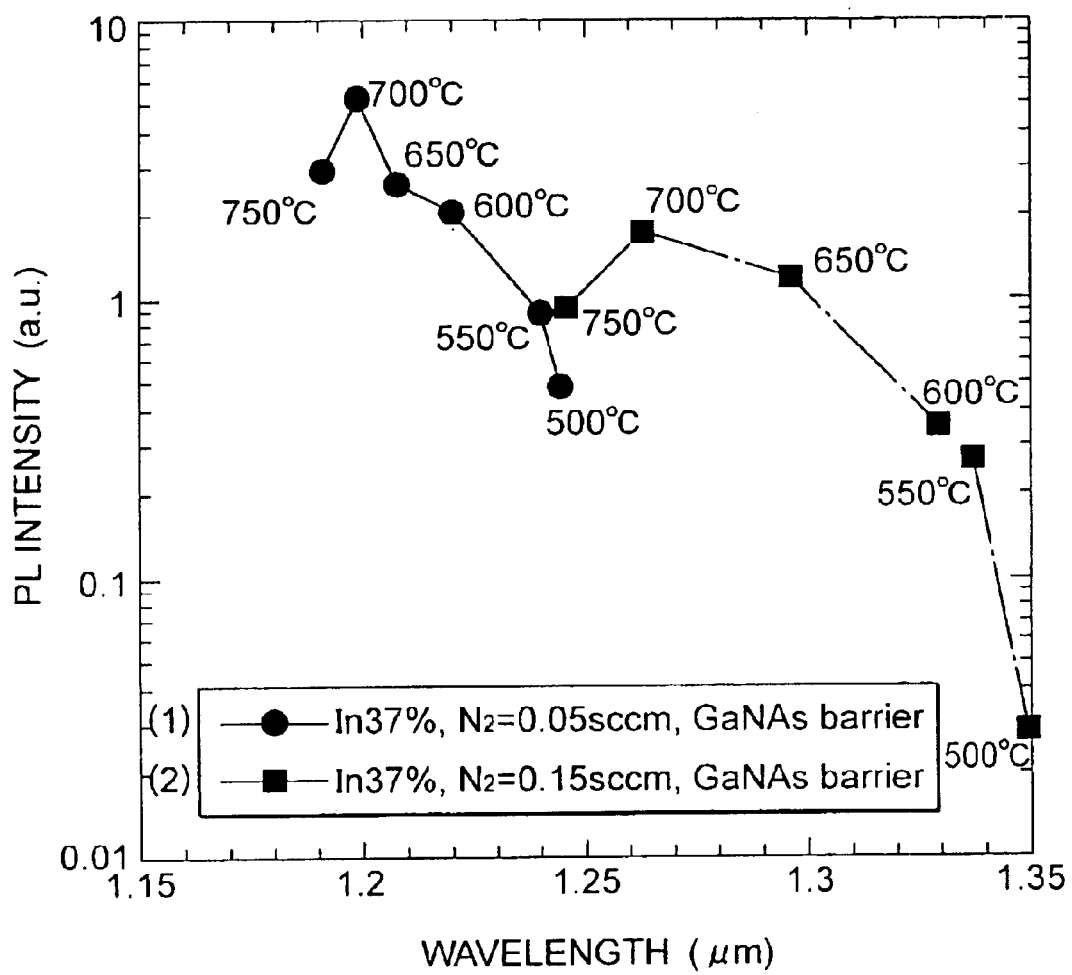
FIG. 4 is a graph showing the relationship between the PL intensity and the wavelength in the case of GaNAs barrier layers.

The results shown in FIG. 4 are also shown in Tables 4 and 5.

TABLE 4

| Treatment temperature (degrees C.) | Wavelength (μm) | PL intensity (a.u.) |
|---|---|---|
| 500 | 1.243 | 0.52 |
| 550 | 1.24 | 0.96 |
| 600 | 1.219 | 2.2 |
| 650 | 1.206 | 2.7 |
| 700 | 1.198 | 5.5 |
| 750 | 1.19 | 3.0 |

(GaNAs barrier, In content of 37%, nitrogen flow rate of 0.05 sccm)

TABLE 5

| Treatment temperature (degrees C.) | Wavelength (μm) | PLURALITY intensity (a.u.) |
|---|---|---|
| 500 | 1.348 | 0.03 |
| 550 | 1.336 | 0.29 |
| 600 | 1.328 | 0.38 |
| 650 | 1.296 | 1.23 |
| 700 | 1.262 | 1.83 |
| 750 | 1.245 | 1.00 |

(GaNAs barrier, In content of 37%, nitrogen flow rate of 0.15 sccm)

The GaNAs barrier layer thermally treated at a temperature of 500 degrees C had a poor PL intensity; however, the GaNAs layer thermally treated at a temperature of 650 degrees C. or above for a longer wavelength had a sharply increased PL intensity.

For example, in the case of $Ga_{0.63}In_{0.37}N_{0.01}As_{0.974}Sb_{0.016}$ well layer for the nitrogen flow rate at 0.15 sccm, a thermal treatment at 650 degrees C. after the epitaxial growth of the QW active layer including $GaN_{0.02}As_{0.98}$ barrier layers enlarged the PL wavelength up to 1.295 μm, and yet increased the PL intensity compatible to the PL intensity obtained in the conventional samples with the PL wavelength of around 1.2 μm, as shown by the square dots.

The comparative examples obtained by the nitrogen flow rate of 0.15 sccm, shown by the square dots in FIG. 4, was subjected to evaluation for the characteristics thereof after annealing at 650 degrees C. The comparative examples exhibited an excellent threshold current density as low as 550 amperes/cm², lased pulsatively at a wavelength of 1.31 μm, and yet had a characteristic temperature of 80K at temperatures ranging between 25 and 85 degrees C., which is poorer compared to the conventional GaInNAs-based laser.

It is to be noted that a similar evaluation for the conventional GaInNAs laser having GaAs barrier layers and a PL wavelength of 1.24 μm exhibited that the conventional laser lased at pulse condition at a wavelength of 1.25 μm, and had a characteristic temperature as high as around 160K at temperatures ranging between 25 degrees C. and 85 degrees C.

It is reported that the deteriorated characteristic temperature generally results from the overflow of carriers from the well layer due to the thermal excitation in the 1.3-μm-band semiconductor laser device.

Accordingly, the present inventors considered to suppress the leakage current caused by the thermal emission in the 1.3-μm-band semiconductor laser device, and calculated the relationship between the characteristic temperature and the energy difference (ΔE) from the pseudo-Fermi-level of the electrons in the well layer to the bottom of the conduction band of the barrier layers. The calculated results are shown in FIG. 5.

Figure 5:
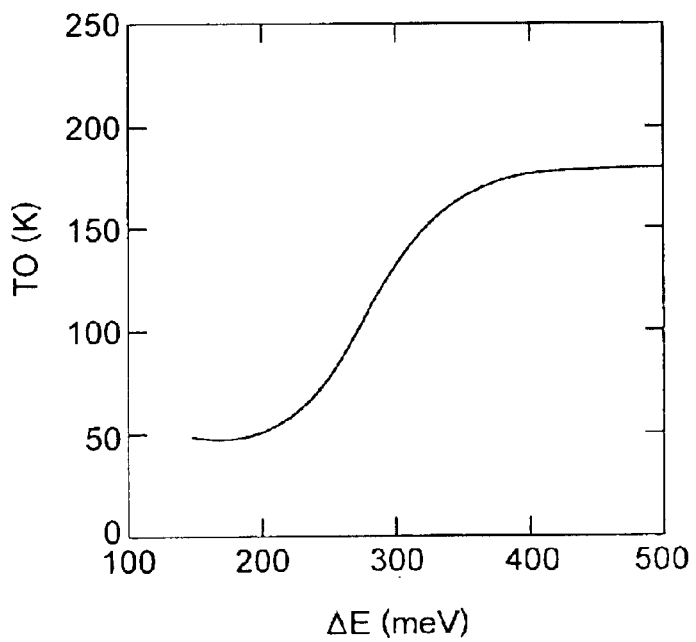
FIG. 5 is a graph showing the calculated results of the relationship between ΔE and the characteristic temperature (T0) of the laser device.

As understood from FIG. 5, for obtaining a characteristic temperature around 180K by suppressing the thermal emission, the energy difference ΔE must be 350 meV or above. Conversely, if the energy difference ΔE is 350 meV or above, it is expected that the 1.3-μm-band semiconductor laser device may have a characteristic temperature equivalent to that of the 0.85-μm-band GaAs semiconductor laser device having a MQW structure, for example, around 180K.

Assuming that the thickness of the well layer is fixed at 8 nm, the energy separation from the first quantum level of electrons to the bottom of the bulk conduction band is about 50 meV. Thus, it is understood that, for obtaining the energy difference ΔE above 350 meV, the offset energy (ΔEc) of the conduction band, i.e., the offset energy of the conduction band between the well layer and the barrier layers must be 400 meV or above.

Among the comparative examples having GaNAs barrier layers, the specified example having a higher PL intensity at a 1.3 μm wavelength had a QW active layer structure including $Ga_{0.63}In_{0.37}N_{0.01}As_{0.974}Sb_{0.016}$ well layer and $GaN_{0.02}As_{0.98}$ barrier layers, as understood from FIG. 4. The offset energy (ΔEc) in the QW structure was estimated at 150 meV, whereas the offset energy (ΔEc) in the QW structure of the 1.25-μm laser having GaAs barrier layers could be estimated at 410 meV, and accordingly, it is considered that the difference in the ΔEc between the lasers caused the difference in the characteristic temperature.

Although the reason for the improvement of the PL intensity by provision of GaNAs barrier layers is not specifically clarified, it is assumed that the nitrogen contents in both the well layer and the barrier layer provide bonds of nitrogen in the interface between the well layer and the barrier layer, forming an approximately-homogeneous junction in the interface and thus improving the crystallinity.

From the above experiments and inferences, the present inventors conceived the idea to form a QW structure by using a GaInNAs(Sb) well layer and GaNPAs barrier layers wherein phosphorous (P) is added to the conventional GaNAs barrier layers having a ΔEc of 400 meV to obtain a mixed crystal for improvement of the crystallinity of the QW structure.

It is to be noted that a higher phosphorous (P) content in the GaNPAs barrier layer causes an increase of tensile strain in the barrier layer in addition to the increase of ΔEc. The well layer generally has a compressive strain around 2.5%. The increase of the tensile strain in the barrier layer caused by the increase of the nitrogen content and the phosphorous content may increase the shearing stress in the interface between the well layer and the barrier layer having opposite strains, thereby increasing the possibility of occurrence of dislocations in the QW structure. In view of this, it is preferable that the GaNPAs barrier layer have a tensile strain of 2.5% or less, more preferably 1.5% or less.

The energy difference ΔE from the pseudo-Fermi-level of electrons in the well layer to the bottom of the conduction band of the barrier layer is preferably 300 meV or above, and more preferably 350 meV or above. For a QW structure including a well layer having a thickness around 8 nm, the offset energy ΔEc is preferably 350 meV or above, and more preferably 400 meV or above.

In view of the above, the present inventors calculated the range of composition of GaNPAs barrier layers in the preferred QW structure, under the condition that the offset energy ΔEc is 350 meV or above and the strain in the barrier layers is 2.5% or less, and under the condition that the offset energy ΔEc is 400 meV or above and the strain in the barrier layers is 1.5% or less. The preferred QW structure as recited herein includes a GaInNAs well layer lasing at an emission wavelength of 1.3 μm and having an indium (In) content at 30 to 40% and a nitrogen content at 0.5 to 2%. The resultant compositions for the GaNPAs barrier layers are shown in FIGS. 6 and 7.

Figure 6:
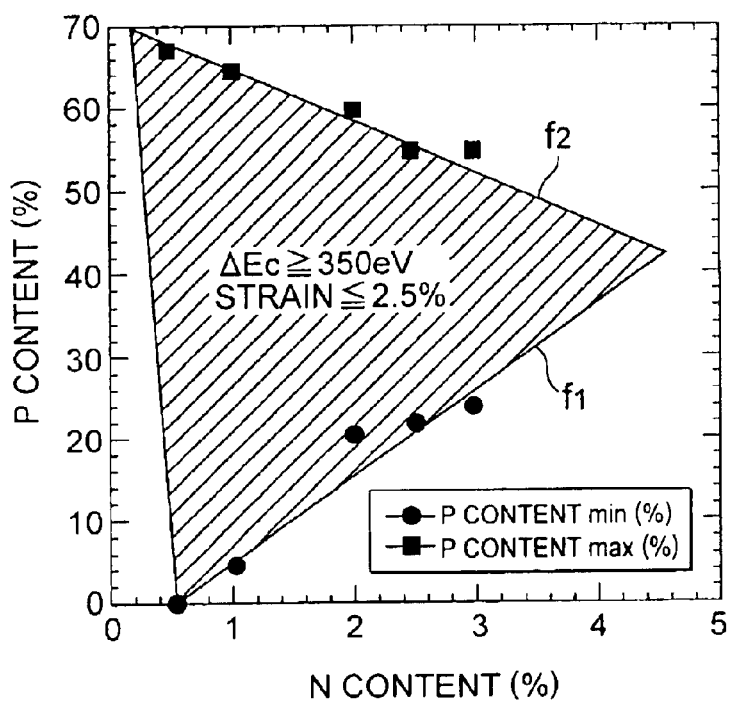
FIG. 6 is a graph showing the possible P (phosphorous) content and N (nitrogen) content of the barrier layers.
Figure 7:
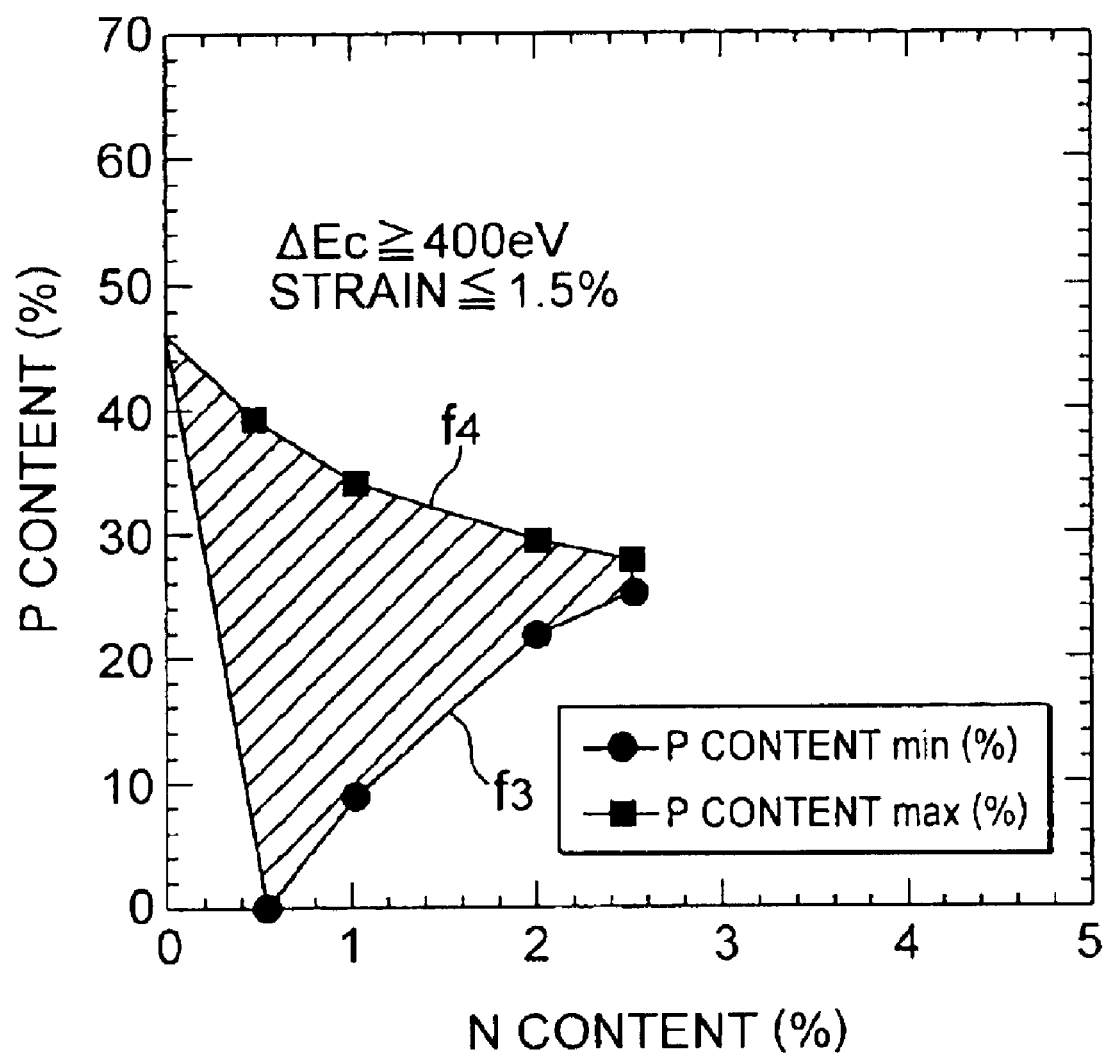
FIG. 7 is a graph showing preferred P and N contents of the barrier layers in the embodiment of the present invention.

FIG. 6 illustrates the composition range for the GaNPAs barrier layers for the case of the offset energy ΔEc being 350 meV or above and the tensile strain in the barrier layers being 2.5% or less.

More specifically, each barrier layer has a composition expressed by $GaN_{y1}P_{y2}As_{1-y1-y2}$ wherein given y1 for the nitrogen content satisfies the relationship $0.001 \leq y1 \leq 0.045$, and given y2 for the phosphorous content satisfies the following relationships:

$$y2 \geq 10.2 \times y1 - 0.0512 \quad \text{(f1); and}$$

$$y2 \leq -6.39 \times y1 + 0.714 \quad \text{(f2).}$$

In the above relationship, the line defined by y2 being equal to the right side in (f1) determines the lower limit of the phosphorous content, and the line defined by y2 being equal to the right side in (f2) determines the upper limit thereof.

FIG. 7 illustrates the composition range for the GaNPAs barrier layers for the case of ΔEc being 400 meV or above and the tensile strain in the barrier layers being 1.5% or less.

More specifically, each barrier layer has a composition expressed by $GaN_{y1}P_{y2}As_{1-y1-y2}$ wherein given y1 for the nitrogen content satisfies the relationship $0.001 \leq y1 \leq 0.028$, and given y2 for the phosphorous content satisfies the following relationships:

$$y2 \geq -4.67 \times y1^2 \times 100 + 27 \times y1 - 0.123 \quad \text{(f3); and}$$

$$y2 \leq 2.67 \times y1^2 \times 100 - 14 \times y1 + 0.463 \quad \text{(f4).}$$

In the above relationships, the line defined by y2 being equal to the right side in (f3) determines the lower limit of the phosphorous content and the line defined by y2 being equal to the right side in (f4) determines the upper limit of the phosphorous content.

By limiting the composition of the GaNPAs barrier layers, a higher offset energy (ΔEc) of the conduction band can be achieved to obtain a higher characteristic temperature, and by incorporating the sufficient amount of nitrogen in the barrier layers, a semiconductor laser device is obtained having an improved crystallinity and a lower threshold current density.

It is to be noted that although Patent Publication JP-A-10-145003 describes a semiconductor laser device including GaNPAs barrier layers and a GaInNAs well layer, the described laser device is directed to a stress compensation type wherein the well layer and the barrier layers have different stresses, and the publication does not recite the specific nitrogen contents and phosphorous contents for the barrier layer as recited herein.

In the composition of $Ga_xIn_{1-x}N_{1-y}As_y$ well layer, the In content (1-x) resides between 0.3 and 0.4, whereas the nitrogen content resides between 0.005 and 0.02. The well layer may be added by a small amount of Sb; for example, 0.3 to 2% of Sb may be added with respect to the amount of V-group atoms. The term "offset energy (ΔEc)" as used herein means the offset energy of conduction band in the QW structure between the bulk well layer and the barrier layers. The term "strain in the barrier layer" means the amount (%) of strain that the barrier layer applies to the GaAs substrate.

The offset energy ΔEc of 350 meV or above and the strain of 2.5% or below in the barrier layer may be achieved by adjusting the phosphorous content between 0% and 70% with the nitrogen content in the GaNPAs barrier layer being maintained between 0.% and 4.5%.

By adjusting the phosphorous content between 0% and 45% with the nitrogen content being maintained between 0.1% and 2.5%, an offset energy ΔEc of 400 meV or above and a tensile strain of 1.5% or below in the barrier layer can be achieved.

In another configuration of the semiconductor laser of the present invention, the QW structure includes a GaInNAs well layer having an In content between 30% and 40% and a nitrogen content between 0.5% and 2%, and a pair of AlGaNAs barrier layers. The nitrogen content improves the crystallinity of the QW structure.

In the specific properties of $Al_xGa_{1-x}N_yAs_{1-y}$, a larger nitrogen content (y) reduces the bandgap energy, whereas a larger Al content (x) increases the bandgap energy. This allows different bandgap energies to be obtained by different compositions. It is to be noted, however, that a larger nitrogen content (y) increases the tensile strain applied to the GaAs substrate. Thus, it is preferable that the nitrogen content (y) satisfy the relationship $0.001 \leq y \leq 0.05$, and in this case the Al content (x) preferably satisfies the relationship $0.01 \leq x \leq 1$, to thereby obtain a bandgap energy that provides an offset energy ΔEc of 350 meV or above.

More preferable composition is such that $0.005 \leq y \leq 0.025$ and $0.1 \leq x \leq 0.5$. In this case, crystallinity of the barrier layers is further improved and a further lower threshold current density can be obtained.

If the nitrogen content (y) is below 0.001, it is difficult to obtain an emission wavelength of 1.3 μm. On the other hand, if the nitrogen content (y) is above 0.05, the crystallinity of the barrier layers is deteriorated, whereby the threshold current density increases.

The QW structure as used in the present invention may be a single QW (SQW) structure or a multiple QW (MQW) structure. The cladding layer may be made of any material so long as the material substantially lattice-matches with the GaAs substrate. The semiconductor laser may be an edge emitting type, or a surface emitting type having a pair of multilayer mirrors. The above experiments are directed mainly to a semiconductor laser device having an emission wavelength of 1.3 μm band. However, the present invention can be applied to, for example, an edge emitting semiconductor laser device lasing at a wavelength of 1.48 μm, 1.55 μm or 1.65 μm band.

In addition, the structures of the resonant cavity and the waveguide are not limited any specific structures. The resonant cavity may have a separate heterostructure (SCH) including an optical confinement layer or a graded-index SCH (GRIN-SCH). The waveguide may be of a ridge waveguide type, a so-called buried hetero-junction (BH) structure or a transverse junction stripe (TJS) type. The present invention may be applied to other optical devices such as a photodiode.

Now, the present invention is more specifically described with reference to a preferred embodiments thereof.

Figure 8:
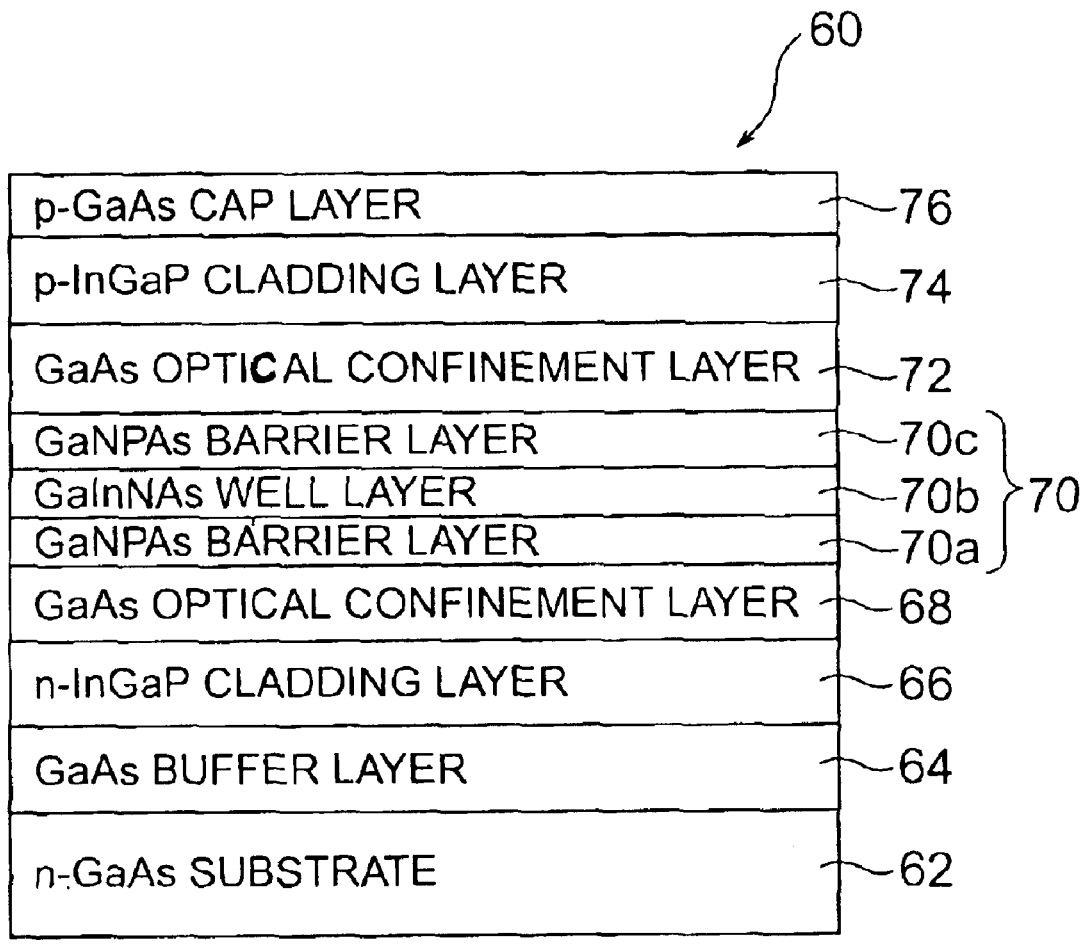
FIG. 8 is a schematic sectional view of the layer structure of a semiconductor laser device according to a first embodiment of the present invention.

Referring to FIG. 8, there is shown a 1.3-μm-band edge emitting semiconductor laser device 60 according to a first embodiment of the present invention. The laser device 60 includes an n-GaAs substrate 62, and a layer structure formed on the (100) lattice plane of the n-GaAs substrate 62 and configured to form a resonant cavity. The layer structure includes, consecutively as viewed from the bottom, a 0.5-μm-thick n-GaAs buffer layer 64 having a carrier density of $1\times10^{18}$ cm$^{-3}$, a 1.5-μm-thick n-In$_{0.48}$Ga$_{0.52}$P cladding layer 66 having a carrier density of $1\times10^{18}$ cm$^{-3}$, a 0.08-μm-thick GaAs optical confinement layer 68, a GaInNAs/GaNPAs SQW active layer structure 70, 0.08-μm-thick GaAs optical confinement layer 72, a 1.5-μm-thick p-In$_{0.48}$Ga$_{0.52}$P cladding layer 74 having a carrier density of $1\times10^{8}$ cm$^{-3}$, a 0.3-μm-thick p-GaAs contact layer 76 having a carrier density of $3\times10^{19}$ cm$^{-3}$.

The GaInNAs/GaNPAs SQW active layer structure 70 includes 8-nm-thick Ga$_{0.63}$In$_{0.37}$N$_{0.01}$As$_{0.99}$ well layer 70b, and a pair of 30-nm-thick GaN$_{0.02}$P$_{0.25}$As$_{0.73}$ barrier layers 70a and 70c sandwiching therebetween the well layer 70b. Each barrier layer has a tensile strain of 1.3%, the offset energy ΔEc of the conduction band is 420 meV, and the bandgap wavelength is 0.82 μm.

The layer structure of the semiconductor laser device of the present embodiment can be grown using a known technique such as gas source technique, MBE technique, CBE technique or MOCVD technique.

After growing the layer structure of FIG. 8, a known photographic etching process is conducted thereto to form a ridge-waveguide semiconductor laser device of a stripe-mesa structure having a 3-μm-wide active layer structure. Thereafter, an Au—Zn or Ti/Pt/Au metallic film having a p-type ohmic property is formed thereon as a p-side electrode, followed by polishing the bottom surface of the n-GaAs substrate 62 to obtain a substrate thickness of about 100 μm, and forming an Au—Ge/Ni/Au metallic film as a n-side electrode at the polished bottom surface. Subsequently, the layer structure is cleaved to form a plurality of device elements, followed by bonding thereof to form a plurality of semiconductor laser devices of the present embodiment.

In this example, the semiconductor laser device has a cavity length set at 300 μm, the front end of the resonant cavity is left as cleaved, and the rear facet of the resonant cavity is coated with a high-reflection coat having a reflectivity of 80%.

Samples of the present embodiment were fabricated and subjected to measurements with respect to the optical output-injection current characteristic thereof. The results of the measurements exhibited a threshold current density as low as 0.5 kA/cm$^2$ at 25 degrees C., and a characteristic temperature as high as 160K for the threshold current between 25 and 85 degrees C.

In the present embodiment, the barrier layer has a composition of GaN$_{0.02}$P$_{0.25}$As$_{0.73}$; however, the barrier layer may have any composition so long as the composition resides within the hatched area of FIG. 6, or preferably within the hatched area of FIG. 7. In addition, the optical confinement layer may be a GaNPAs layer instead.

Figure 9:
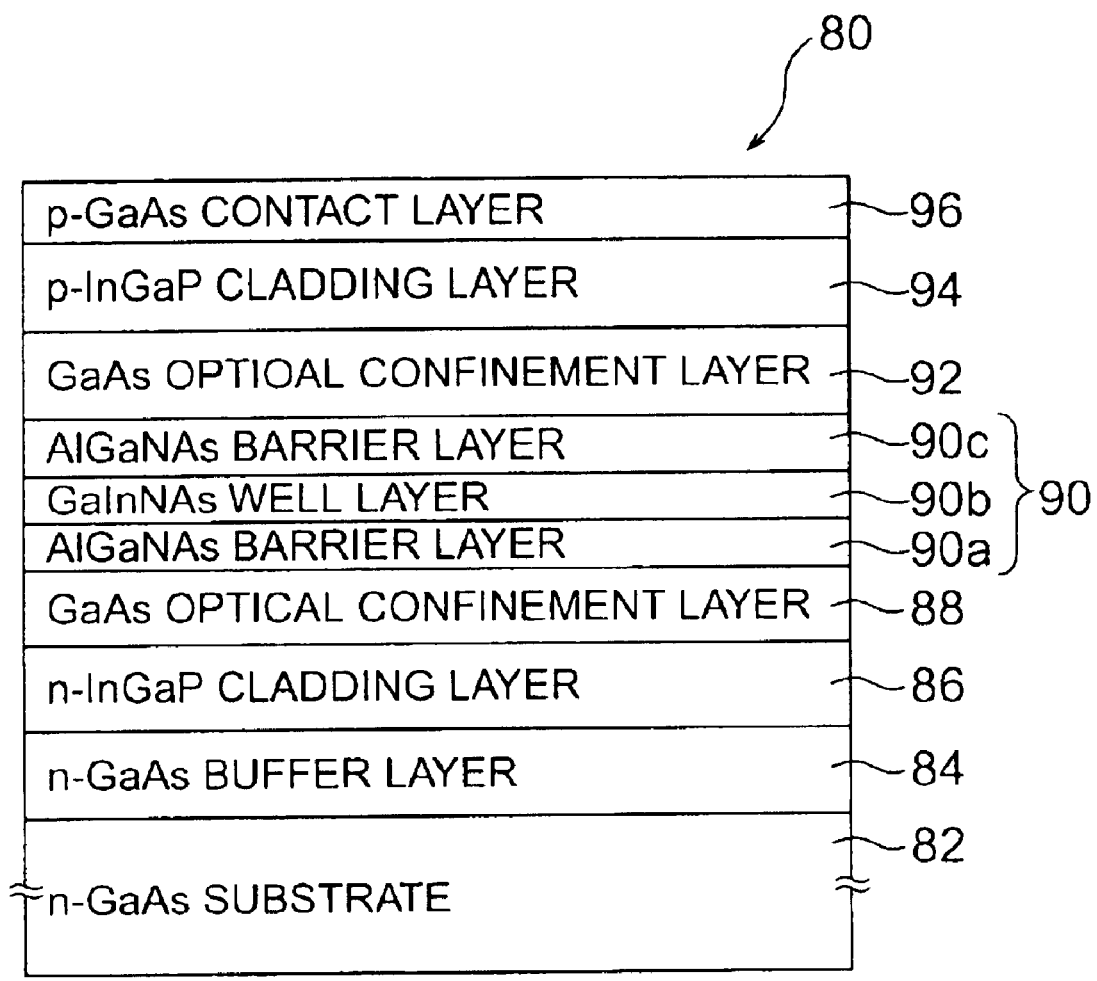
FIG. 9 is a schematic sectional view of the layer structure of a semiconductor laser device according to a second embodiment of the present invention.

Referring to FIG. 9, there is shown the layer structure of a 1.3-μm-band end-emitting semiconductor laser device of a ridge waveguide type according to a second embodiment of the present invention. The semiconductor laser device 80 includes an n-GaAs substrate 82, and a layer structure formed on the (100) lattice plane of the n-GaAs substrate 82 and configured to form resonant cavity. The layer structure includes, consecutively as viewed from the bottom, a 0.5-μm-thick n-GaAs buffer layer 84 having a carrier density of $1\times10^{18}$ cm$^{-3}$, a 1.5-m-thick n-In$_{0.48}$Ga$_{0.52}$P cladding layer 86 having a carrier density of $1\times10^{18}$ cm$^{-3}$, a 0.08-μm-thick GaAs optical confinement layer 88, a GaInNAs/AlGaNAs SQW active layer structure 90, 0.08-μm-thick GaAs optical confinement layer 92, a 1.5-μm-thick p-In$_{0.48}$Ga$_{0.52}$P cladding layer 94 having a carrier density of $10^{18}$ cm$^{-3}$, and a 0.3-μm-thick p-GaAs contact layer 96 having a carrier density of $3\times10^{19}$ cm$^{-3}$.

The GaInNAs/AlGaNAs SQW active layer structure 90 includes 8-nm-thick Ga$_{0.63}$In$_{0.37}$N$_{0.01}$As$_{0.99}$ well layer 90b, and a pair of 30-nm-thick Al$_{0.4}$GaN$_{0.02}$As barrier layers 90a and 90c sandwiching therebetween the well layer 90b. Each barrier layer has a tensile strain of 0.35%, the offset energy ΔEc of the conduction band is 350 meV, and the bandgap wavelength is 0.85 μm.

The layer structure of the semiconductor laser device of the present embodiment can be grown using a known technique such as gas source technique, MBE technique, CBE technique or MOCVD technique.

After growing the layer structure of FIG. 9, a known photographic etching process is conducted thereto to form a ridge-waveguide semiconductor laser device of a stripe-mesa structure having a 3-μm-wide active layer structure. Thereafter, an Au—Zn metallic film having a p-type ohmic property is formed thereon as a p-side electrode, followed by polishing the bottom surface of the n-GaAs substrate 82 to obtain a substrate thickness of about 100 μm, and forming an Au—Ge/Ni/Au metallic film as a n-side electrode at the polished bottom surface. Subsequently, the layer structure is cleaved to form a plurality of device elements, followed by bonding thereof to form a plurality of semiconductor laser devices of the present embodiment.

In this example, the semiconductor laser device has a cavity length set at 300 μm, the front facet of the resonant cavity is left as cleaved, the rear facet of the resonant cavity is coated with a high-reflection coat having a reflectivity of 80%.

Samples of the present embodiment were fabricated and subjected to measurements with respect to the optical output-injection current characteristic thereof The results of the measurements exhibited a threshold current density as low as 0.5 kA/cm$^2$ at 25 degrees C., and a characteristic temperature as high as 160K for the threshold current between 25 and 85 degrees C.

In the present embodiment, the barrier layer has a composition of Al$_{0.4}$GaN$_{0.02}$As; however, the barrier layer may have another composition wherein the nitrogen content is reduced by half to 1% and the Al content is reduced also to 20%, fore example. In this case, a barrier layer can be obtained having a tensile strain of 0.17% and providing an offset energy (ΔEc) of 350 meV. In addition, the optical confinement layer may be an AlGaNAs layer instead.

In the first and second embodiments, a GaInNAs layer is used as the well layer in the QW structure; however, a $Ga_xIn_{1-x}N_{1-y-z}As_ySb_z$ may be used as the well layer. The cladding layer may be an AlGaAs layer instead.

The QW structure may be a MQW structure of a strain compensation type. The optical confinement layer may be an $Al_xGa_{1-x}As$ layer having a GRIN-SCH structure instead of the GaAs layer having a SCH structure. The semiconductor laser device may be a stripe laser such as a TJS laser or a buried hetero-junction structure instead of the ridge-waveguide laser device.

Figure 10:
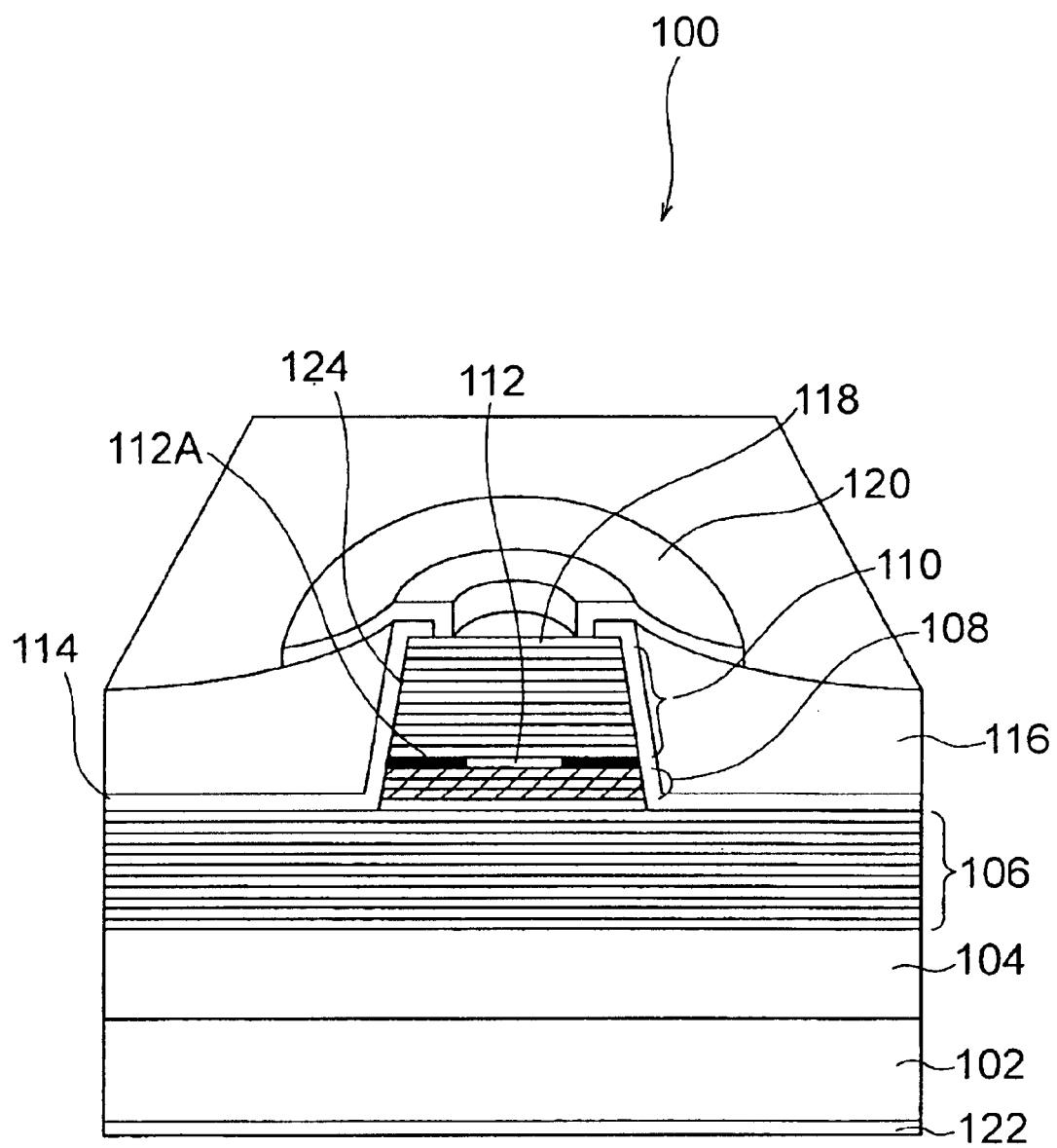
FIG. 10 is a schematic perspective view of a typical vertical cavity surface emitting semiconductor laser device

Referring to FIG. 10, there is shown a 1.3-μm-band surface-emitting semiconductor laser device 100 having a GaInNAsSb/GaNAsP QW active layer structure according to a third embodiment of the present invention.

The laser device 100 includes an n-GaAs substrate 102, and a layer structure formed on the (100) lattice plane of the n-GaAs substrate 102. The layer structure includes, consecutively as viewed from the bottom, a 0.5-μm-thick n-GaAs buffer layer 104 having a carrier density of $1 \times 10^{18}$ cm$^{-3}$, a lower distributed Bragg reflector (DBR) mirror 106, a resonant cavity 108, an upper DBR mirror 110, and a p-type cap layer 118.

The lower DBR mirror 106 includes a plurality (30, in this example) of layer pairs each including an n-$Al_{0.9}$GaAs layer and an n-GaAs layer. Each layer has a thickness of $$\frac{\lambda}{4n},$$

given λ being emission wavelength and given n being refractive index. The upper DBR mirror 110 includes a plurality (25, in this example) of layer pairs each including a p-$Al_{0.9}$GaAs layer and a p-GaAs layer.

The λ-resonant cavity 108 includes a 150-nm-thick GaAs lower cladding layer 134a, a 150-nm-thick GaAs upper cladding layer 134b, and a GaInNAsSb/GaNAsP double QW (DQW) structure sandwiched therebetween. Referring additionally to FIG. 11, the DQW structure includes 7-nm-thick $Ga_{0.63}In_{0.37}N_{0.01}As_{0.974}Sb_{0.016}$ well layers 132b and 132d each having a compressive strain of 2.5%, and 20-nm-thick $GaN_{0.02}P_{0.25}As_{0.73}$ barrier layers 132a, 132c and 132e, each two of which sandwiches therebetween a corresponding one of the well layers 132b and 132d.

An AlAs layer 112 having an annular Al-oxidized area 112A and a circular Al-non-oxidized area is interposed between the resonant cavity 108 and the upper DBR mirror 110 for efficient confinement of the injection current. The Al-oxidized annular area 112A functions as a current blocking area and the Al-non-oxidized area functions as a current injection area, thereby forming a current confinement structure for the resonant cavity 108.

A protective SiN film 114 is formed on the layer structure including the mesa structure, and a polyimide layer 116 is formed on the sides of the mesa structure. A p-side electrode 120 having an annular shape is disposed on the polyimide layer 116, and an n-side electrode 122 is formed on the bottom surface of the GaAs substrate 102.

In the semiconductor laser device of FIG. 10, the tensile strain of the barrier layer is 1.3%, the offset energy ΔEc is 420 meV, and the bandgap wavelength is 0.82 μm. A sample of the semiconductor laser device of the present embodiment exhibited a threshold current of 2 mA at the room temperature, and lased in a CW lasing mode at a temperature above 100 degrees C.

The first and second embodiments are directed to exemplified 1.3-μm-band semiconductor laser devices. The present, however, can be applied to 1.48 μm–1.55 μm- and 1.65 μm-band semiconductor laser devices.

Since the above embodiments are described only for examples, the present invention is not limited to the above embodiments and various modifications or alterations can be easily made therefrom by those skilled in the art without departing from the scope of the present invention.

In the claims below, consistent with conventional notation, when a compound is described as a combination of group III and group V elements such as AlGaNAs or GaInNAs(Sb) and no subscripts are provided denoting the amounts of the group III and group V atomic constituents relative to one another, no limitation on the stoichiometry within the group III or group V elements is present or should be inferred. That is, any of the listed group III elements may be present from 0 to 100% relative to the total amount of group III atoms, and any of the listed group V elements may be present from 0 to 100% relative to the total amount of group V atoms.

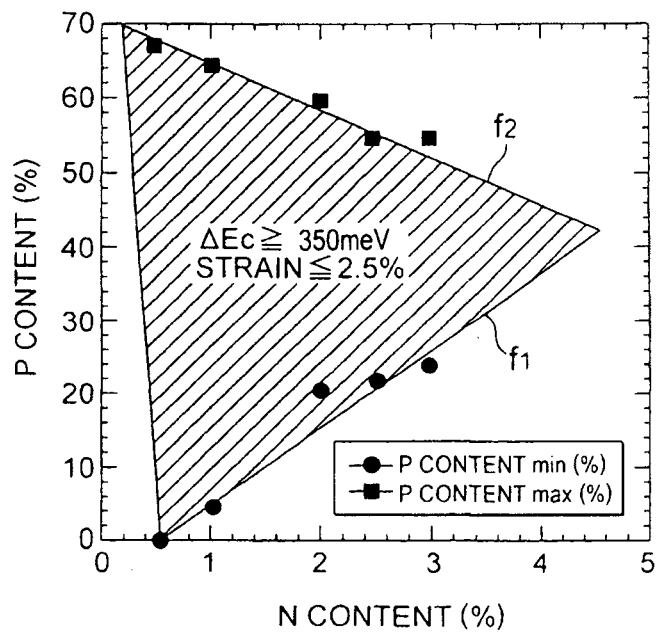

What is claimed is:

1. A semiconductor laser having an active layer structure comprising:

a first barrier layer including at least some phosphorous and nitrogen and having, with respect to group V atoms, a phosphorous content of less than about 70 percent and a nitrogen content of less than about 4.5 percent;

a second barrier layer having, with respect to group V atoms, a phosphorous content of less than about 70 percent and a nitrogen content of less than about 4.5 percent; and a well layer disposed between said first and second barrier layers.

2. The semiconductor laser of claim 1, wherein said semiconductor laser has an emission wavelength of 1.25 μm or higher.

3. The semiconductor laser of claim 1, wherein said active layer structure has a conduction band offset energy of equal to or greater than about 350 milli-electron-volts.

4. The semiconductor laser of claim 3, wherein each of said first and second barrier layers has a strain of less than or equal to about 2.5%.

5. The semiconductor laser of claim 1, wherein said active well layer consists essentially of GaInNAs(Sb).

6. The semiconductor laser of claim 5, wherein at least one of said first and second barrier layers consists essentially of $GaN_{y1}P_{y2}As_{1-y1-y2}$, wherein $0.001 \leq y1 \leq 0.045$ and $10.2 \times y1 - 0.0512 \leq y2 \leq -6.39 \times y1 + 0.714$.

7. The semiconductor laser of claim 5, wherein at least one of said first and second barrier layers consists essentially of $GaN_{y1}P_{y2}As_{1-y1-y2}$, wherein $0.001 \leq y1 \leq 0.028$ and $-4.67 \times y1^2 \times 100 + 27 \times y1 - 0.123 \geq y2 \leq 2.67 \times y1^2 \times 100 - 14 \times y1 + 0.463$.

8. A semiconductor laser having an active layer structure comprising:

a first barrier layer comprising at least seine phosphorous and nitrogen and having, with respect to group V atoms, a phosphorous content of less than about 45 percent and a nitrogen content of less than about 2.5 percent;

a second barrier layer having, with respect to group V atoms, a phosphorous content of less than about 45 percent and a nitrogen content of less than about 2.5 percent; and a well layer disposed between said first and second barrier layers.

9. The semiconductor laser of claim 8, wherein said active layer structure has a conduction hand offset energy of equal to or greater than about 400 milli-electron-volts.

10. The semiconductor laser of claim 8, wherein each of said first and second barrier layers has a strain of less than or equal to about 1.5%.

11. An active layer structure, comprising:
a first barrier layer,
a second barrier layer;
a well layer disposed between said first and second barrier layers;
means for producing a conduction band offset energy equal to or higher than about 350 milli-electron-volts between said active layer and each of said barrier layers;
means for producing a strain of first and second barrier layers equal to or lower than about 25%.

12. The active layer structure of claim 11, wherein said active layer structure is part of a resonant cavity of a semiconductor laser device.

13. The active layer structure of claim 11, wherein said active layer structure is used in a photodiode.

14. A semiconductor laser having an active layer structure comprising:
a first barrier layer consisting essentially of AlGa(In)NAs;
a second barrier layer consisting essentially of AlGa(In)NAs; and
a GaInNAs(Sb) well layer disposed between said first and second barrier layers, said active well layer having an indium content between about 30 and 40 percent with respect to group III atoms, and a nitrogen content between about 0.5 and 2 percent with respect to group V atoms.

15. The active layer structure of claim 14, wherein at least one of said first and second barrier layers consists essentially of $Al_xGa_{1-x}N_yAs_{1-y}$, wherein $0.1 \leq x \leq 0.5$ and $0.005 \leq y \leq 0.025$.

16. The semiconductor laser of claim 15, wherein said active layer structure has a conduction band offset energy of equal to or greater than about 350 milli-electron-volts.

17. The active layer structure of claim 14, wherein at least one of said first and second barrier layers consists essentially of $Al_xGa_{1-x}N_yAs_{1-y}$, wherein $0.01 \leq x \leq 1$ and $0.001 \leq y \leq 5.05$.

18. The semiconductor laser of claim 17, wherein said active layer structure has a conduction band offset energy of equal to or greater than about 400 milli-electron-volts.

19. The semiconductor laser of claim 14, wherein said active layer structure has a bandgap wavelength of about 0.82 µm.

20. The semiconductor laser of claim 14, wherein said first and second barrier layers have a tensile strain of less than or equal to about 0.5%.

21. The semiconductor laser of claim 14, wherein said first and second barrier layers have a tensile strain of less than or equal to about 0.35%.

22. A semiconductor laser having an active layer structure comprising:
a first barrier layer composed essentially of AlGaNAs;
a second barrier layer composed essentially of AlGaNAs; and
a well layer disposed between said first and second barrier layers, said active well layer having an indium content between about 30 and 40 percent with respect to group ill atoms, and a nitrogen content between about 0.5 and 2 percent with respect to group V atoms.

23. The semiconductor laser of claim 22, wherein said active layer structure has a conduction band offset energy of more than or equal to about 350 milli-electron-volts.

24. The semiconductor laser of claim 22, wherein said active layer structure has a bandgap wavelength of about 0.85 µm.

25. The semiconductor laser of claim 22, wherein said first and second barrier layers have a tensile strain of less than or equal to about 0.5%.

26. The semiconductor laser of claim 22, wherein said first and second barrier layers have a tensile strain of less than or equal to about 0.35%.

27. A semiconductor laser device comprising:
a GaAs substrate; and
a resonant cavity formed on said GaAs substrate for emitting laser, said resonant cavity including a quantum well (QW) active layer structure having a GaInNAs (Sb) well layer and a pair of barrier layers sandwiching therebetween said GaInNAs(Sb) well layer,
said QW active layer structure having a conduction band offset energy (ΔEc) equal to or higher than about 350 milli-electron-volts (meV) between said well layer and said barrier layer, each of said barrier layers having a strain equal to or lower than about 2.5%.

28. The semiconductor laser device as defined in claim 27, wherein said QW active layer structure has a conduction band offset energy equal to or higher than about 400 meV and a strain equal to or lower than 1.5%.

29. The semiconductor laser device as defined in claim 27, wherein each of said barrier layers is a $GaN_{y1}P_{y2}As_{1-y1-y2}$ layer.

30. The semiconductor laser device as defined in claim 29, wherein y1 satisfies the relationship $0.001 \leq y1 \leq 0.045$, and y2 satisfies the following relationships:

$$y2 \geq 10.2 \times y1 - 0.0512; \text{ and}$$

$$y2 \leq -6.39 \times y1 + 0.714.$$

31. The semiconductor laser device as defined in claim 27, wherein y1 satisfies the relationship $0.001 \leq y1 \leq 0.028$, and y2 satisfies the following relationships:

$$y2 \geq -4.67 \times y1^2 \times 100 + 27 \times y1 - 0.123; \text{ and}$$

$$y2 \leq 2.67 \times y1^2 \times 100 - 14 \times y1 + 0.463.$$

32. The semiconductor laser device as defined in claim 27, wherein said resonant cavity has an emission wavelength of 1.25 µm or higher.

33. The semiconductor laser device as defined in claim 27, wherein said resonant cavity is of an edge emitting type.

34. The semiconductor laser device as defined in claim 27, wherein said resonant cavity is of a surface emitting type.

35. A semiconductor laser device comprising:

a GaAs substrate; and a resonant cavity formed on said GaAs substrate for emitting laser, said resonant cavity including a quantum well (QW) active layer structure having a GaInNAs(Sb) well layer and a pair of $Al_xGa_{1-x}N_yAs_{1-y}$ barrier layers sandwiching therebetween said GaInNAs(Sb) well layer, wherein $0.01 \leq x \leq 1$ and $0.001 \leq y \leq 0.05$.

36. The semiconductor laser device as defined in claim 35, wherein $0.1 \leq x \leq 0.5$ and $0.005 \leq y \leq 0.025$.

37. The semiconductor laser device as defined in claim 35, wherein said resonant cavity has an emission wavelength of 1.25 $\mu$m or higher.

38. The semiconductor laser device as defined in claim 35, wherein said resonant cavity is of an edge emitting type.

39. The semiconductor laser device as defined in claim 35, wherein said resonant cavity is of a surface emitting type.

* * * * *

UNITED STATES PATENT AND TRADEMARK OFFICE
CERTIFICATE OF CORRECTION

PATENT NO. : 6,858,863 B2
DATED : February 22, 2005
INVENTOR(S) : Hitoshi Shimizu et al.

It is certified that error appears in the above-identified patent and that said Letters Patent is hereby corrected as shown below:

Column 13,
Line 50, change "$0.01 \leqq x \leqq 1$" to -- $0.01 \leq x \leq 1$ --
Line 51, change "$0.001 \leqq y \leqq 5.05$" to -- $0.001 \leq y \leq 0.05$ --

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,858,863 B2
APPLICATION NO. : 10/094733
DATED : February 22, 2005
INVENTOR(S) : Hitoshi Shimizu et al.

It is certified that error appears in the above-identified patent and that said Letters Patent is hereby corrected as shown below:

Delete Title Page, and replace with new Title Page. (attached)

In the drawings, Figure 6, change "350eV" to --350meV--

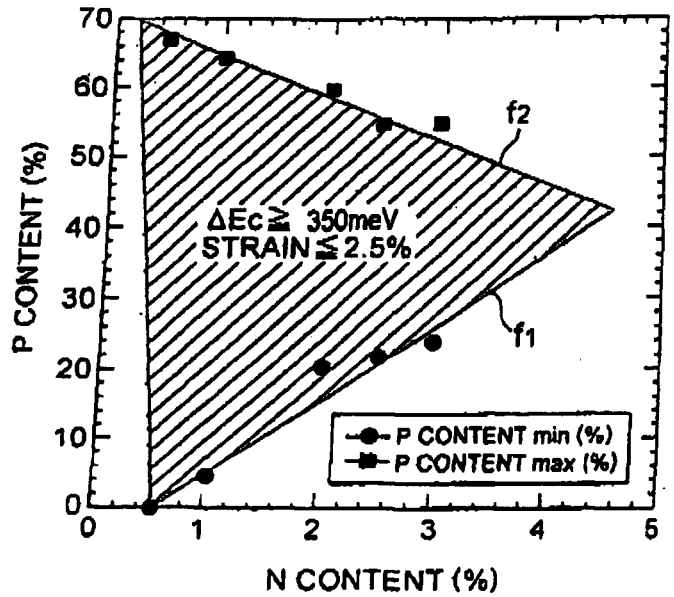

Signed and Sealed this
Tenth Day of April, 2012

David J. Kappos
*Director of the United States Patent and Trademark Office*

CERTIFICATE OF CORRECTION (continued)

In the drawings, Figure 7, change "400eV" to --400meV--

FIG. 7

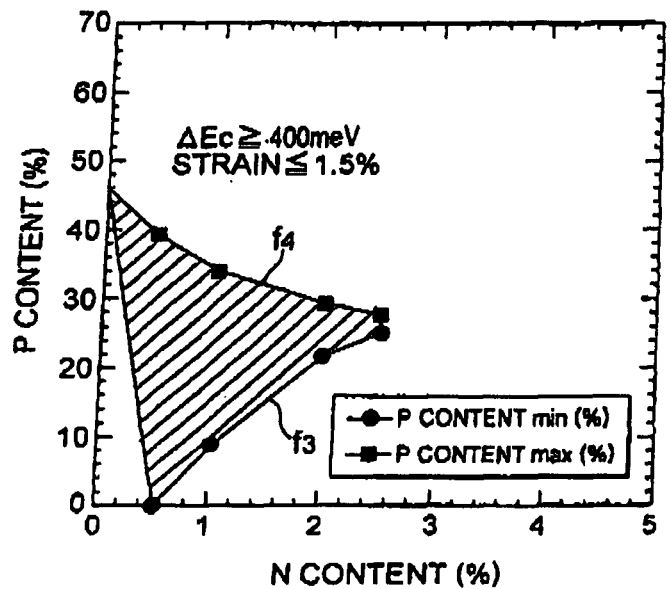

CERTIFICATE OF CORRECTION (continued)

U.S. Pat. No. 6,858,863 B2

Page 3 of 3

(12) United States Patent
Shimizu et al.

(10) Patent No.: US 6,858,863 B2
(45) Date of Patent: Feb. 22, 2005

(54) SEMICONDUCTOR LASER DEVICE HAVING A HIGH CHARACTERISTIC TEMPERATURE

(75) Inventors: Hitoshi Shimizu, Tokyo (JP); Kouji Kumada, Tokyo (JP); Norihiro Iwai, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 10/094,733

(22) Filed: Mar. 8, 2002

(65) Prior Publication Data

US 2003/0013224 A1 Jan. 16, 2003

(30) Foreign Application Priority Data

| | | |
|---|---|---|
| Apr. 25, 2001 | (JP) | 2001-127476 |
| Sep. 17, 2001 | (JP) | 2001-281240 |

(51) Int. Cl.$^7$ .............................................. H01L 29/06
(52) U.S. Cl. ............................ 257/16; 257/18; 257/22
(58) Field of Search .......................... 257/101, 14, 16, 257/17, 18, 22, 94, 88, 90, 96, 97, 103, 189

(56) References Cited

U.S. PATENT DOCUMENTS

| | | | |
|---|---|---|---|
| 6,153,894 A | * | 11/2000 | Udagawa .................. 257/96 |
| 2002/0034203 A1 | * | 3/2002 | Shimizu et al. ............ 372/45 |

FOREIGN PATENT DOCUMENTS

JP  2000-277867  6/2000

* cited by examiner

*Primary Examiner*—Wael Fahmy
*Assistant Examiner*—Ginette Peralta
(74) *Attorney, Agent, or Firm*—Oblon, Spivak, McClelland, Maier & Neustadt, P.C.

(57) ABSTRACT

A semiconductor laser device includes a resonant cavity formed on a GaAs substrate, the resonant cavity including a quantum well (QW) active layer structure having a GaInNAs(Sb) well layer and a pair of barrier layers. The QW structure has a conduction band offset energy ($\Delta Ec$) equal to or higher than 350 milli-electron-volts (meV) between the well layer and the barrier layers, and each of the barrier layers a tensile strain equal to or lower than 2.5%.

39 Claims, 10 Drawing Sheets